United States Patent
Wilson et al.

[11] Patent Number: 6,060,919
[45] Date of Patent: May 9, 2000

[54] CMOS PREFERRED STATE POWER-UP LATCH

[75] Inventors: Dennis R. Wilson, Colorado Springs; William F. Kraus, Palmer Lake, both of Colo.

[73] Assignee: Ramtron International Corporation, Colorado Springs, Colo.

[21] Appl. No.: 09/205,033

[22] Filed: Dec. 4, 1998

[51] Int. Cl.$^7$ .................................................. H03K 3/37
[52] U.S. Cl. ........................... 327/143; 327/208; 327/210
[58] Field of Search ................................. 327/142, 143, 327/198, 199, 205, 206, 208, 209, 210, 215, 219, 222; 365/205

[56] References Cited

U.S. PATENT DOCUMENTS

| | | | |
|---|---|---|---|
| 3,983,543 | 9/1976 | Cordaro | 365/205 |
| 3,983,545 | 9/1976 | Cordaro | 365/205 |
| 4,581,552 | 4/1986 | Womack et al. | 327/142 |
| 4,591,745 | 5/1986 | Shen | 327/143 |
| 4,902,910 | 2/1990 | Msieh | 327/143 |
| 5,115,146 | 5/1992 | McClure et al. | 327/143 |
| 5,161,159 | 11/1992 | McClure et al. | 371/22.1 |
| 5,336,944 | 8/1994 | Fischer | 327/74 |
| 5,361,229 | 11/1994 | Chiang et al. | 365/189.05 |
| 5,706,232 | 1/1998 | McClure et al. | 365/201 |

*Primary Examiner*—Tuan T. Lam
*Attorney, Agent, or Firm*—Peter J. Meza, Esq.; Carol E. Burton, Esq.

[57] ABSTRACT

A preferred state power-up latch circuit includes first and second cross-coupled P-channel transistors coupled to a first source of supply voltage, first and second cross-coupled N-channel transistors coupled to a second source of supply voltage, the transistors being coupled together to form a latch having an output node, in which at least one of the gate lengths is unequal to the other gates lengths in order to establish a preferred state upon power-up, and the gate width of all the transistors is equal.

24 Claims, 2 Drawing Sheets

CMOS PREFERRED STATE POWER-UP LATCH

BACKGROUND OF THE INVENTION

This invention relates generally to CMOS latch circuits. More particularly, the present invention relates to a method and apparatus for reliably placing the latch in a preferred logic state upon power-up to the full supply voltage level.

A CMOS cross-coupled latch that reliably powers up in a predictable state (one side high, one side low, with a single-sided output reflecting the preferred logic state) can be very useful in an integrated circuit. The preferred logic state latch circuit output may be buffered and driven globally to many destinations on an integrated circuit. The latch circuit output can be used to properly initialize certain nodes in the integrated circuit so that it is ready for normal operation.

A typical cross-coupled latch is shown in FIG. 1, including cross-coupled P-channel transistors M1 and M2, and cross-coupled N-channel transistors M3 and M4. The sources of transistors M1 and M2 are coupled together and to a source of power supply voltage $V_{DD}$, which is typically five, 3.3, or three volts. The sources of transistors M3 and M4 are coupled together and to a source of power supply voltage $V_{SS}$, which is typically ground voltage, zero volts, but can be a negative power supply voltage such as minus five volts.

As can be seen in the labels associated with transistors M1–M4 of FIG. 1, by placing relatively "strong" and "weak" devices connecting to the appropriate nodes, the latch can be reliably depended upon to power-up in the preferred state. A "strong" device is defined as a device whose W/L ratio is greater than a "weak" device. Consequently, the "strong" device will have a greater saturation current than a "weak" device, as is well known in the art. In the latch shown in FIG. 1, a "High" output node coupled to the drains of transistors M1 and M3, and the gates of transistors M2 and M4 will usually power-up in a logic high state, and a "Low" output node coupled to the drains of transistors M2 and M4, and the gates of transistors M1 and M3 will usually power-up in a logic low state.

Conventional methods to design the preferred-state latch shown in FIG. 1 usually involve varying the gate widths (the "W" in the W/L ratio) of the respective devices to dictate the relative device strength. The gate widths of the strong devices (M1 and M4) are designed to be larger than that of the weak devices (M2 and M3). Before power-up all circuit nodes are at the same voltage. As $V_{DD}$ rises from the same potential as $V_{SS}$ to that of the specified power supply range, the latch can be expected to power-up in the correct state. This is due to the intrinsic ability of the strong devices to conduct more current (because of the greater W/L ratio) than can be conducted by the weak devices, thereby influencing the logic state of the latch. Once a small differential voltage between the output nodes is realized the inherent positive feedback of this circuit configuration results in the attainment of the full proper logic state.

While the above describes the desirable outcome, the preferred or "designed-in" power-up logic state is not always attained in a real-world circuit. Before a voltage differential in the direction of the preferred state occurs, possibly while the latch circuit devices are still in subthreshold conduction, the conventional approach can result in the wrong data state due to the influence of parasitic gate-to-source/drain overlap capacitance terms ($C_{GS}$ or $C_{GD}$). The gate-to-source capacitance terms may provide capacitive coupling in the opposite direction required to attain the preferred state. These coupling terms could provide negative feedback, and not the desired positive feedback. The negative feedback, in turn, can reduce the reliability of the latch to consistently power-up in the expected state for all possible combinations of temperature, voltage, power supply ramp rate, or processing variations.

What is desired, therefore, is a preferred state power-up latch that will reliably enter into the preferred state over a wide range of environmental and electrical operating conditions.

SUMMARY OF THE INVENTION

It is, therefore, a principal object of the present invention to increase the reliability of a preferred state power-up latch.

According to the present invention a preferred state power-up latch circuit includes first and second cross-coupled P-channel transistors coupled to a first source of supply voltage, first and second cross-coupled N-channel transistors coupled to a second source of supply voltage, the transistors being coupled together to form a latch having an output node, in which at least one of the gate lengths is unequal to the other gates lengths in order to establish a preferred state upon power-up, and the gate width of all the transistors is equal.

The foregoing and other objects, features and advantages of the invention will become more readily apparent from the following detailed description of a preferred embodiment of the invention which proceeds with reference to the accompanying drawings.

DETAILED DESCRIPTION

Figure 1:
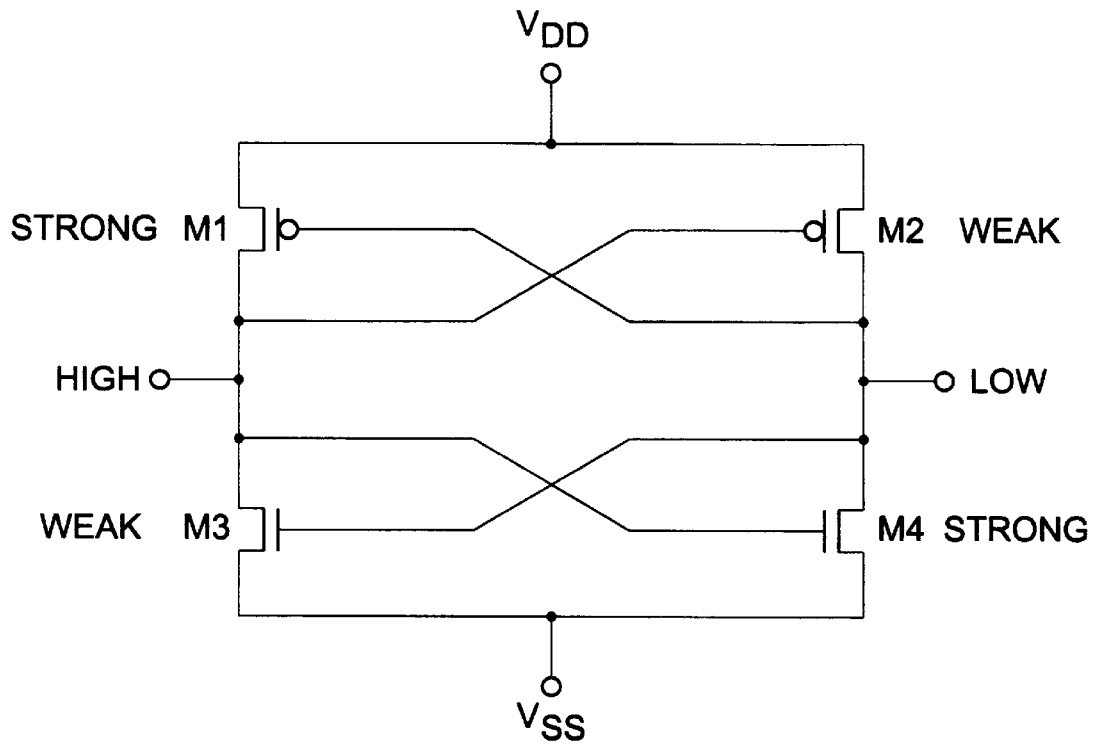
FIG. 1 is a schematic diagram of a prior art preferred state power-up latch.
Figure 2:
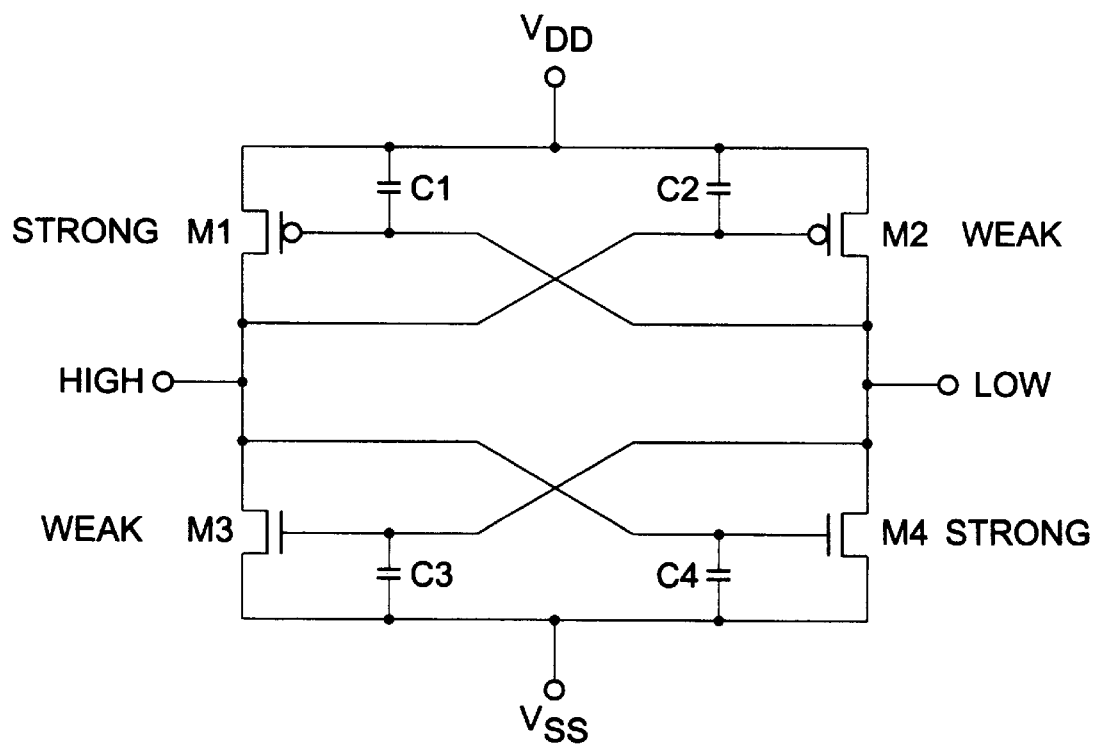
FIG. 2 is a schematic diagram of a preferred state power-up latch including the parasitic gate-to-source capacitors associated with the latch transistors.

Referring now to FIG. 2, the parasitic gate-to-source capacitors are shown as lumped capacitor elements C1–C4. The magnitude of the gate-to-source overlap capacitance $C_{GS}$ is strictly a function of the device's gate width, and is typically expressed in units of fF/$\mu$m (femto-farads per micron), so the effective capacitance due to gate-to-source overlap is calculated as follows:

$$C_{GS}=C_{GSO}W$$

In the above equation W is the device gate width and $C_{GSO}$ is the linear unit capacitance based on process-specific parameters. As mentioned earlier, the conventional designs use longer gate widths to achieve stronger devices. Therefore, the CGS terms will be highest for the stronger devices, so capacitors C1 and C4 are relatively large while capacitors C2 and C3 are relatively small. The undesirable, imbalanced coupling occurs when the power supply node $V_{DD}$ is rising. The coupling is imbalanced in that capacitor C1 couples more strongly into output node LOW as compared to the weaker coupling of capacitor C2 into output node HIGH. Both of these coupling effects directly oppose entering into the desired preferred state. The above-described coupling effects are the most significant in the circuit due to the fact that $V_{DD}$ is a dynamic node, but there also exists imbalanced coupling from the $V_{SS}$ power supply to the LOW and HIGH output nodes via capacitors C3 and C4. This imbalanced coupling is also opposite that desired to obtain the preferred state.

In the latch circuit of the present invention these imbalanced coupling terms are corrected by the use a constant device gate width for devices M1–M4, thus insuring that all of the gate-to-source coupling terms are equal. For the approach used in the present invention the preferred state is realized instead by dictating the relative strength of the devices by adjusting the gate length, which has no effect on gate-to-source overlap capacitance. Thus, the weaker devices have longer gate lengths while the stronger devices have shorter gate lengths, which could be as short as the process minimum.

Figure 3:
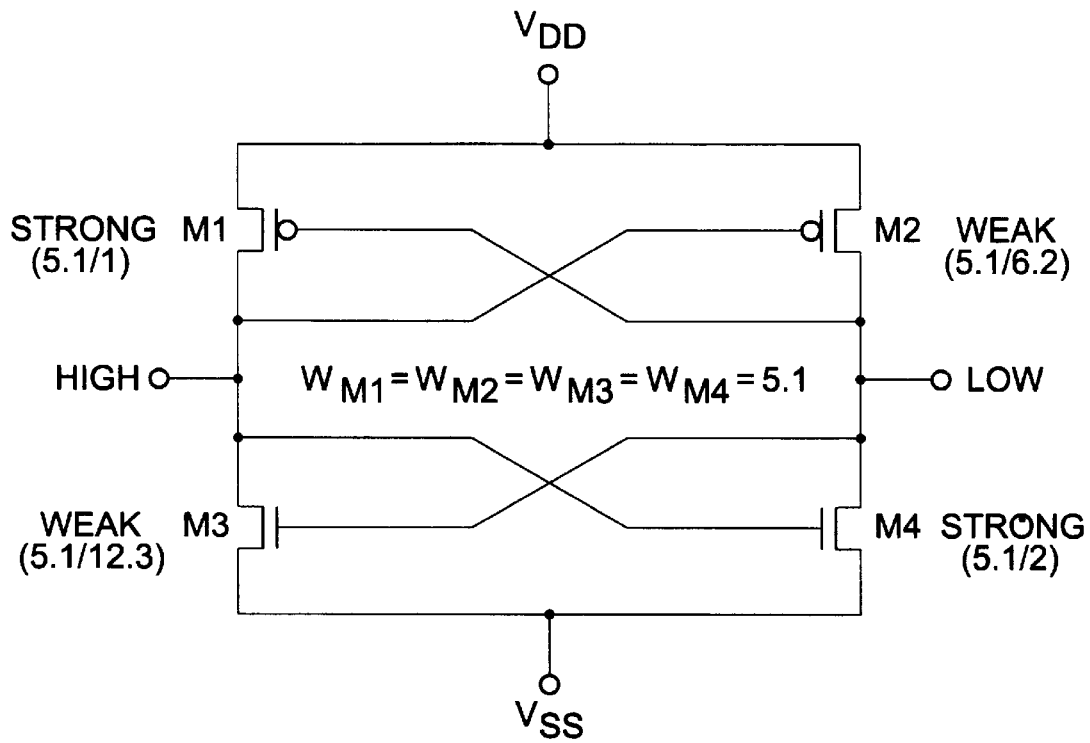
FIG. 3 is a schematic diagram of a preferred state power-up latch according to the present invention in which all of the latch transistors have equal gate widths.

The latch circuit of the present invention is shown in FIG. 3 in which the gate widths of transistors M1, M2, M3, and M4 are all equal in order to provide maximum reliability in attaining the preferred output state. A pair of cross-coupled P-channel transistors includes a strong transistor M1 and a weak transistor M2. A pair of cross-coupled N-channel transistors includes a strong transistor M4 and a weak transistor M3. Both pairs of transistors are coupled together as shown in FIG. 3 to form a latch circuit having a preferred state upon power-up, the gate widths (W) of each transistor being equal to about 5.1 microns in the preferred embodiment of the present invention.

The sources of the first and second cross-coupled P-channel transistors M1 and M2 are coupled to a first source of supply voltage, $V_{DD}$, which typically ranges between three and five volts. The sources of the first and second cross-coupled N-channel transistors M3 and M4 are coupled to a second source of supply voltage, $V_{SS}$, which is typically ground potential or a negative voltage such as minus five volts.

In order to provide a preferred output state at power-up, at least one of the gate lengths of the transistors is set to be unequal to the other gates lengths. The preferred state of the output node (formed by the drains of the second P-channel transistor M2 and the second N-channel transistor M4) during power-up is a logic low. An additional output node (formed by the drains of the first P-channel transistor M1 and the first N-channel transistor M3) has a preferred logic high state during power-up.

To further improve reliability in the preferred state latch of the present invention it is important to ensure that glitches upon power-up are not misinterpreted by the logic that is driven by the latch. It is therefore desirable that only the LOW output node be utilized by the external logic. This is to mitigate concerns that, while $V_{DD}$ is ramping up but still at a low potential (e.g. less than one volt), the HIGH output node may not necessarily appear as a logic level one to the external logic. In other words, it is deemed safer to rely on the LOW output node being interpreted as a logic zero than to rely on the HIGH output node being interpreted as a logic one at low voltages. Under low voltage operating conditions the two output nodes may not yet be equal to the power rail voltages since the latch devices are at or near turn-on.

The gate widths, lengths, and various ratios used in the transistors of the present invention are set forth in FIG. 3 and described in further detail below. While specific values are given for these quantities, it will be appreciated by those skilled in the art that they may be changed as required. In particular, CMOS processing equipment used by others may allow significantly smaller transistor widths than those described below.

As shown in FIG. 3, the gate length of the second P-channel transistor M2 is greater than the gate length of the first P-channel transistor M1. Also, the gate length of the first N-channel transistor M3 is greater than the gate length of the second N-channel transistor M4. The gate width of all the transistors is set to about five microns (5.1 microns). The W/L ratio of the first P-channel transistor M1 is about 5.1 (5.1/1), the W/L ratio of the second P-channel transistor M2 is about 0.8 (5.1/6.2), the W/L ratio of the first N-channel transistor M3 is about 0.4 (5.1/12.3), and the W/L ratio of the second N-channel transistor M4 is about 2.6 (5.1/2).

Analyzing the latch of FIG. 3 further, it can be seen that the ratio of the length of the second P-channel transistor M2 to the length of the first P-channel transistor M1 is about 6.2 (6.2/1). The ratio of the length of the first N-channel transistor M3 to the length of the second N-channel transistor M4 is also about 6.2 (12.3/2). Thus, the ratio of the length of the second P-channel transistor M2 to the length of the first P-channel transistor M1 is substantially equal to the ratio of the length of the first N-channel transistor M3 to the length of the second N-channel transistor M4.

A method of designing a power-up latch circuit having a preferred output state of the type including a pair of cross-coupled P-channel transistors and a pair of cross-coupled N-channel transistors has been described and includes setting the length of at least one of the transistors to a value different from the length of the other transistors and setting equal widths in all of the transistors. The gate length of a second P-channel transistor greater than the gate length of a first P-channel transistor and the gate length of a first N-channel transistor greater than the gate length of a second N-channel transistor.

The matched gate-to-source overlap capacitor in the latch circuit of the present invention is achieved using equal device widths in the four latch transistors. This technique controls coupling from the turned-off devices to the power supply rails during power-up. The increased channel length of the weak devices ensures that when the devices turn on the channel capacitance (as defined by the device area, W×L, multiplied by the gate oxide capacitance per unit area) is larger from the source-drain area of the weak device, M2. The coupling through the on-channel of the weak device M2 to the high node is therefore larger than through the strong device M1 to the low node. This further ensures that the latch powers up in the correct state. This analysis of the proper sizing of the width-length products pertains to N-channel transistors M3 and M4 as well.

Figure 4:
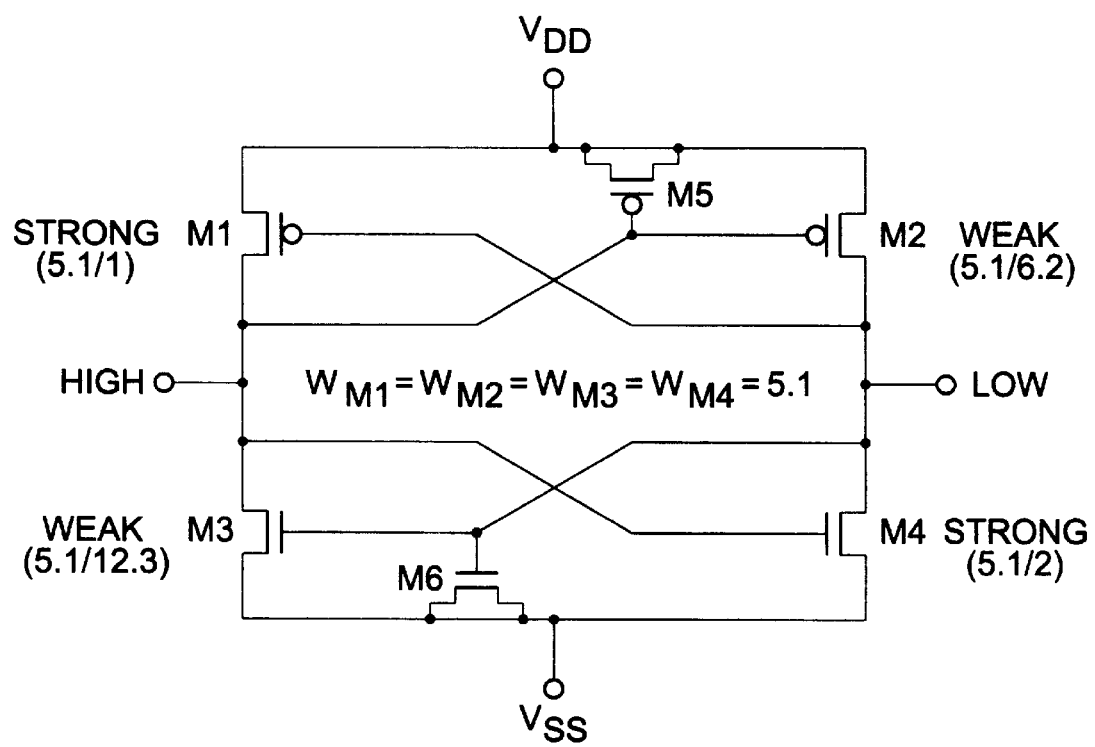
FIG. 4 is a schematic diagram of a preferred state power-up latch according to the present invention further including two optional capacitor-connected transistors.

Referring now to FIG. 4, optional capacitor-connected devices M5 and M6 whose source-drains are tied to the power supply rails $V_{DD}$ and $V_{SS}$, respectively, ensure that the overlap capacitance from gate-to-source is in favor of coupling to the high node through M5 and as a load to the low node via M6. The width of these devices can be set equal to the other device widths or larger depending on the anticipated edge rates of the power supply.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

We claim:

1. A preferred state power-up latch circuit comprising:
   a pair of cross-coupled P-channel transistors including a strong transistor and a weak transistor; and
   a pair of cross-coupled N-channel transistors including a strong transistor and a weak transistor,
   wherein both pairs of transistors are coupled together to form a latch circuit having a preferred state upon power-up, the gate widths of each transistor being equal.

2. A preferred state power-up latch circuit comprising:
   first and second cross-coupled P-channel transistors coupled to a first source of supply voltage;
   first and second cross-coupled N-channel transistors coupled to a second source of supply voltage;
   the transistors being coupled together to form a latch having an output node, in which
   at least one of the gate lengths is unequal to the other gates lengths in order to establish a preferred state upon power-up, and
   the gate width of all the transistors is equal.

3. The latch circuit of claim 2 in which the gate length of the second P-channel transistor is greater than the gate length of the first P-channel transistor.

4. The latch circuit of claim 2 in which the gate length of the first N-channel transistor is greater than the gate length of the second N-channel transistor.

5. The latch circuit of claim 2 in which the preferred state of the output node during power-up is a logic low.

6. The latch circuit of claim 2 in which the output node is formed by the drains of the second P-channel transistor and the second N-channel transistor.

7. The latch circuit of claim 2 further comprising an additional output node having a preferred logic high state during power-up.

8. The latch circuit of claim 7 in which the additional output node is formed by the drains of the first P-channel transistor and the first N-channel transistor.

9. The latch circuit of claim 2 in which the gate width of all the transistors is about five microns.

10. The latch circuit of claim 2 in which the W/L ratio of the first P-channel transistor is about 5.1.

11. The latch circuit of claim 2 in which the W/L ratio of the second P-channel transistor is about 0.8.

12. The latch circuit of claim 2 in which the W/L ratio of the first N-channel transistor is about 0.4.

13. The latch circuit of claim 2 in which the W/L ratio of the second N-channel transistor is about 2.6.

14. The latch circuit of claim 2 in which the ratio of the length of the second P-channel transistor to the length of the first P-channel transistor is about 6.2.

15. The latch circuit of claim 2 in which the ratio of the length of the first N-channel transistor to the length of the second N-channel transistor is about 6.2.

16. The latch circuit of claim 2 in which the ratio of the length of the second P-channel transistor to the length of the first P-channel transistor is substantially equal to the ratio of the length of the first N-channel transistor to the length of the second N-channel transistor.

17. The latch circuit of claim 2 in which the first source of supply voltage is between three and five volts.

18. The latch circuit of claim 2 in which the second source of supply voltage is substantially ground potential.

19. The latch circuit of claim 2 in which the width-length product of the second P-channel transistor is greater than the width-length product of the first P-channel transistor.

20. The latch circuit of claim 2 in which the width-length product of the first N-channel transistor is greater than the width-length product of the second N-channel transistor.

21. The latch circuit of claim 2 further comprising a capacitor-coupled transistor coupled between a gate and a source of the second P-channel transistor.

22. The latch circuit of claim 2 further comprising a capacitor-coupled transistor coupled between a gate and a source of the first N-channel transistor.

23. A method of designing a power-up latch circuit having a preferred output state of the type including a pair of cross-coupled P-channel transistors and a pair of cross-coupled N-channel transistors, the method comprising:
   setting the length of at least one of the transistors to a value different from the length of the other transistors; and
   setting equal widths in all of the transistors.

24. The method of claim 23 in which the step of setting length of at least one of the transistors comprises:
   setting the gate length of a second P-channel transistor greater than the gate length of a first P-channel transistor; and
   setting the gate length of a first N-channel transistor greater than the gate length of a second N-channel transistor.

* * * * *